(12) United States Patent
Nagasawa et al.

(10) Patent No.: US 8,129,623 B2
(45) Date of Patent: Mar. 6, 2012

(54) RESIN FILM, ADHESIVE SHEET, CIRCUIT BOARD, AND ELECTRONIC APPARATUS

(75) Inventors: Tadashi Nagasawa, Yasu (JP); Masaharu Shirai, Yasu (JP); Kenji Kume, Yasu (JP); Yutaka Tsukada, Yasu (JP)

(73) Assignee: Kyocera Corporation, Kyoto (JP)

( * ) Notice: Subject to any disclaimer, the term of this patent is extended or adjusted under 35 U.S.C. 154(b) by 767 days.

(21) Appl. No.: 12/162,770

(22) PCT Filed: Jan. 29, 2007

(86) PCT No.: PCT/JP2007/051420
§ 371 (c)(1),
(2), (4) Date: Oct. 29, 2008

(87) PCT Pub. No.: WO2007/086568
PCT Pub. Date: Aug. 2, 2007

(65) Prior Publication Data
US 2009/0314526 A1    Dec. 24, 2009

(30) Foreign Application Priority Data

Jan. 30, 2006  (JP) .................................. 2006-021412
Feb. 28, 2006  (JP) .................................. 2006-053715

(51) Int. Cl.
*H05K 1/03*  (2006.01)
*H05K 1/16*  (2006.01)
*H05K 1/11*  (2006.01)
*B32B 3/02*  (2006.01)

(52) U.S. Cl. ........ 174/255; 174/256; 174/258; 174/259; 361/750; 361/751; 428/156; 428/172

(58) Field of Classification Search ........................ None
See application file for complete search history.

(56) References Cited

U.S. PATENT DOCUMENTS

| 4,615,763 | A  |   | 10/1986 | Gelorme et al. ............... 156/643 |
|-----------|----|---|---------|---------------------------------------|
| 6,242,079 | B1 | * | 6/2001  | Mikado et al. ................ 428/209 |
| 6,376,049 | B1 | * | 4/2002  | Asai et al. .................... 428/209 |
| 6,613,987 | B2 |   | 9/2003  | Seki et al. ..................... 174/258 |
| 6,773,121 | B2 | * | 8/2004  | Miyatake et al. ............. 359/601 |
| 7,245,434 | B2 | * | 7/2007  | Nishida et al. ................ 359/599 |

(Continued)

FOREIGN PATENT DOCUMENTS

JP    60-214594    10/1985

(Continued)

OTHER PUBLICATIONS

Japanese language office action dated Jun. 28, 2011 and its English language translation for corresponding Japanese application 2007556042.

*Primary Examiner* — Boris Chervinsky
(74) *Attorney, Agent, or Firm* — DLA Piper LLP (US)

(57) ABSTRACT

The invention relates to a resin film having a high adhesiveness to other materials, an adhesive sheet, a circuit board and an electronic apparatus in which an adhesive layer and the resin film are firmly adhered. A resin film (1) includes a plurality of projected portions (10) each having a filler (9) in an apex portion (10a) and a resin material. The projected portions (10) are formed on at least one surface of a sheet portion (16).

15 Claims, 7 Drawing Sheets

U.S. PATENT DOCUMENTS

| | | |
|---|---|---|
| 7,415,761 B2 * | 8/2008 | Hirose et al. ............... 29/852 |
| 7,624,502 B2 * | 12/2009 | Nishii ............................. 29/852 |
| 2006/0163718 A1 | 7/2006 | Kurihara |
| 2010/0124631 A1 * | 5/2010 | Horio et al. .................. 428/142 |

FOREIGN PATENT DOCUMENTS

| | | |
|---|---|---|
| JP | 60214594 A | 10/1985 |
| JP | 61-168291 | 7/1986 |
| JP | 63-090542 | 4/1988 |
| JP | 63-090543 | 4/1988 |
| JP | 01-104632 | 4/1989 |
| JP | 09-296057 | 11/1997 |
| JP | 10508720 A | 8/1998 |
| JP | 2000036521 A | 2/2000 |
| JP | 2000-294922 | 10/2000 |
| JP | 2002190671 A | 7/2002 |
| JP | 2004088092 A | 3/2004 |
| JP | 2005-101269 | 4/2005 |
| WO | 9609158 A1 | 3/1996 |

* cited by examiner

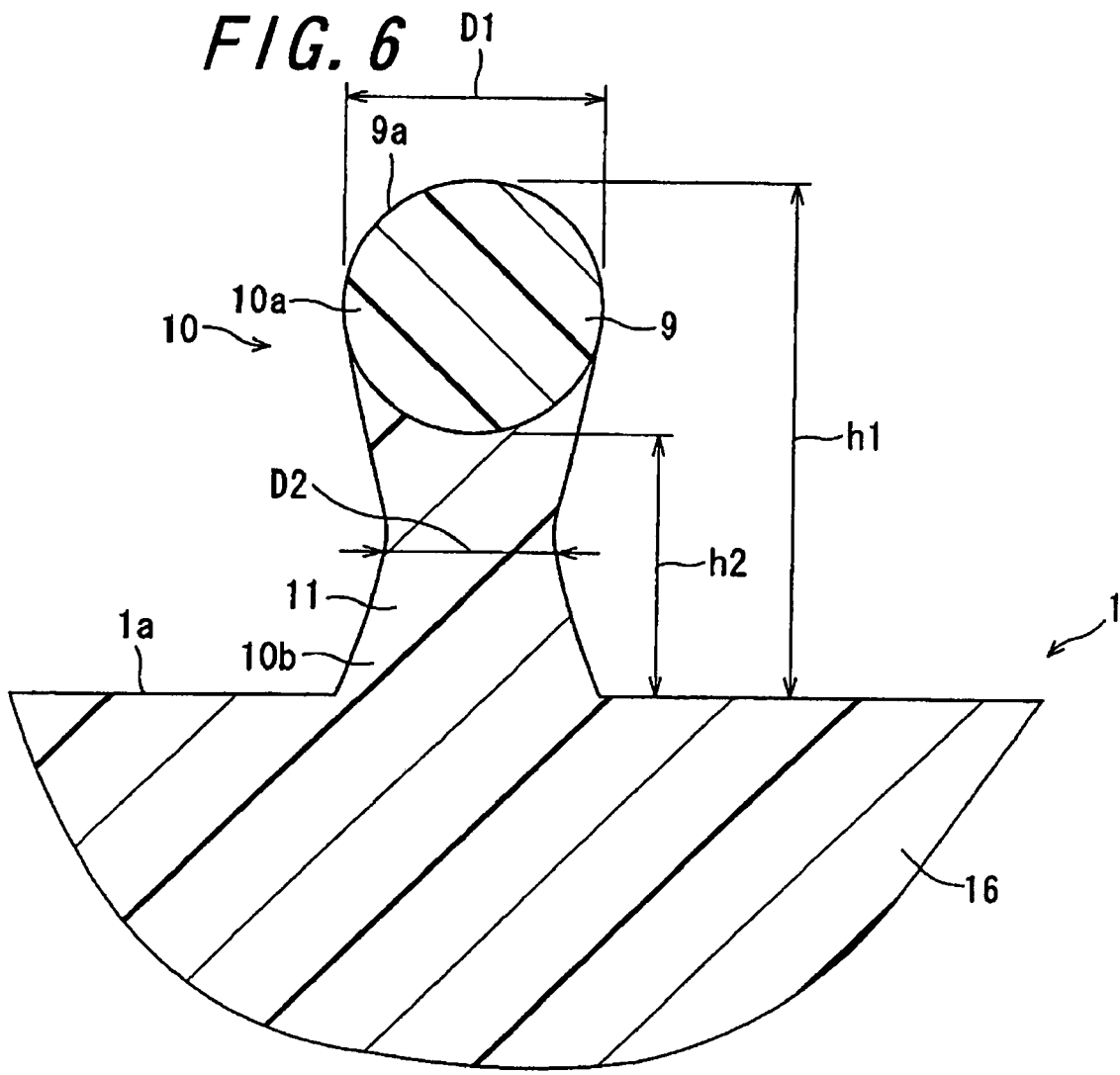

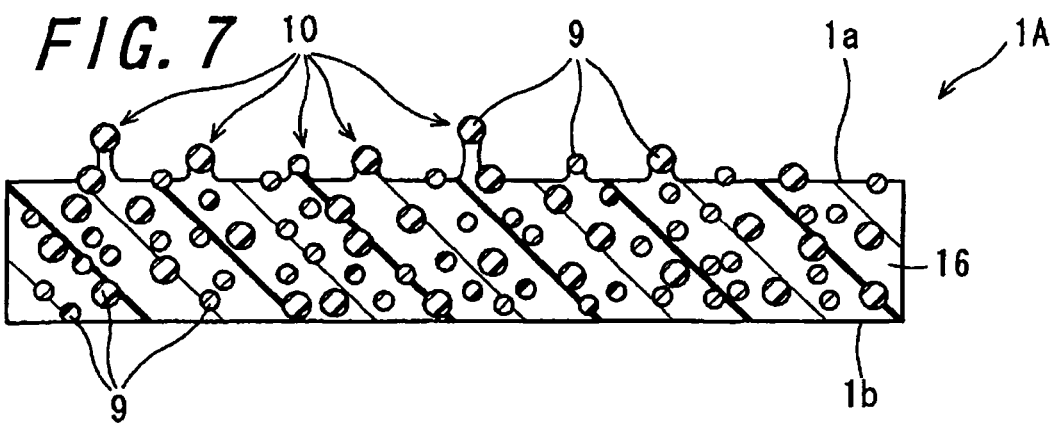
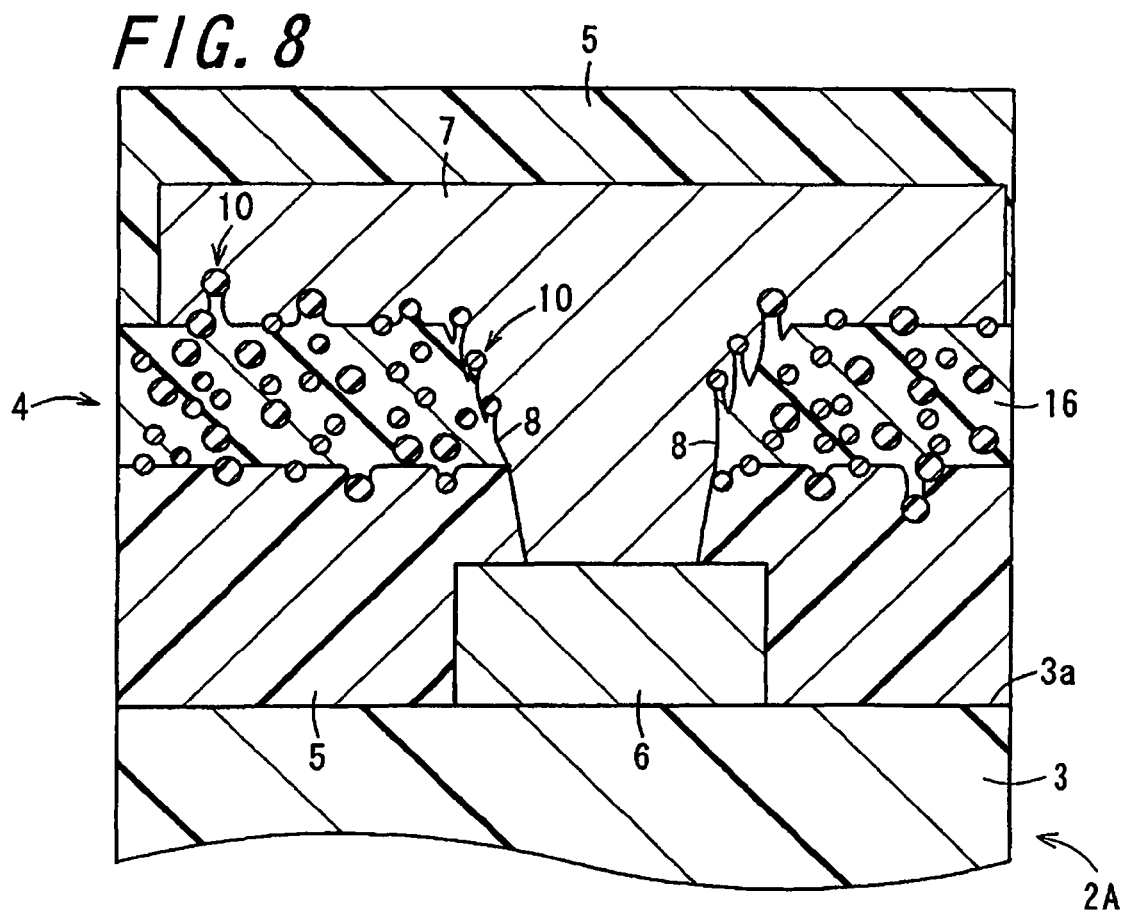

RESIN FILM, ADHESIVE SHEET, CIRCUIT BOARD, AND ELECTRONIC APPARATUS

CROSS-REFERENCE TO THE RELATED APPLICATIONS

This application is a national stage of international application No. PCT/JP2007/051420 filed Jan. 29, 2007, and claims benefit of priority under 35 USC 119 to Japanese Patent Application No. 2006-021412 filed Jan. 30, 2006 and Japanese Patent Application No. 2006-053715 filed Feb. 28, 2006. The entire contents of all of these applications are incorporated herein by reference.

TECHNICAL FIELD

The present invention relates to a resin film having insulating properties, and a circuit board using the same, an adhesive sheet, and an electronic apparatus.

RELATED ART

With an increase in processing speed of a semiconductor element mounted on a multilayer circuit board, it has been required to reduce dielectric constant of insulating materials that constitute the semiconductor element. In materials having low dielectric constant, a propagation speed of electric signals is high and signal delay in the semiconductor element is reduced, resulting that it is possible to accelerate the processing speed of the semiconductor element. In order to further reduce the dielectric constant of such materials having low dielectric constant, there is a technology that a material contains air bubbles therein. This technology reduces the dielectric constant since an insulating material contains air bubbles, however, strength of the material is reduced to one-third or less because of the air bubbles. When the strength of the material is reduced in this way, there arises a problem that the semiconductor element is damaged by a difference between coefficients of thermal expansion of the multilayer circuit board and the semiconductor element.

Further, as the number of I/Os (input/output) of the semiconductor element increases, the semiconductor element itself has been increasingly miniaturized because of a higher density in the semiconductor element. With such a miniaturization of the semiconductor element, a bump that connects the semiconductor element and the multilayer circuit board has been smaller. The miniaturization of the bump causes a problem that connection strength of an electrode by the bump is lowered and the bump is broken to thereby be lowered in its yield rate. The cause of a stress to break the bump results from a mismatch between coefficients of thermal expansion of the multilayer circuit board and the semiconductor element. Accordingly, the multilayer circuit board is required to have a coefficient of thermal expansion equivalent to that of the semiconductor element.

In order to solve such a problem, a multilayer circuit board in a conventional technology comprises a conductive layer and an insulating layer on a core board having insulating properties. The core board has a laminate on one surface portion in a thickness direction, in which a conductive layer and an insulating layer are laminated alternately. The laminate has with through-holes penetrating in the thickness direction, and the through-holes are plated with copper to form via-holes. Accordingly, the conductive layers lying near to each other in the thickness direction are electrically connected through the via-hole. The insulating layer includes a resin film and an adhesive layer, and is configured so that the multilayer circuit board has low coefficient of thermal expansion. In addition, since it is possible to form a thin insulating layer, an amount of the thermal expansion in the multilayer circuit board can be reduced. Thereby, in the multilayer circuit board, it is possible to eliminate a trouble by the mismatch of the coefficient of thermal expansion with the semiconductor element (refer to, for example, Japanese Unexamined Patent Application Publication 2005-101269).

In the multilayer circuit board of the above-mentioned conventional technology, the insulating layer has a structure that the resin film and the adhesive layer are laminated alternately, an adhesiveness of the resin film and the adhesive layer is weak because the resin film has a smooth surface portion. Accordingly, the resin film and the adhesive layer can be separated. If the resin film and the adhesive layer are separated, the insulating properties with the adjacent conductive layer can be reduced.

SUMMARY OF THE INVENTION

An object of the invention is to provide a resin film having a high adhesiveness to other members, an adhesive sheet, a circuit board and an electronic apparatus in which an adhesive layer and a resin film are firmly adhered.

According to one of the invention, a resin film comprises a plurality of projected portions on a surface of the resin film. Each of the projected portions comprises a filler and a resin material with the filler at an apex thereof. Such a resin film is applicable to an insulating layer in the adhesive sheet, and an insulating layer in a circuit board.

According one of the invention, it is possible to enhance adhesion strength between the resin film and other members. Accordingly, when the resin film is used for the insulating layer in the adhesive sheet, and the insulating layer in the circuit board, reliability for them can be improved. In addition, it is possible to improve reliability for the electronic apparatus having the circuit board.

BRIEF DESCRIPTION OF DRAWINGS

The above and other objects, features, and advantages of the invention will be more explicit from the following detailed description taken with reference to the drawings.

FIG. 6 is an enlarged sectional view showing one of projected portions 10.

FIG. 7 is an enlarged sectional view showing a resin film 1A of a second embodiment of the invention.

FIG. 8 is a sectional view showing an enlarged partial constitution of a multilayer circuit board 2A according to a third embodiment of the invention.

DESCRIPTION OF THE PREFERRED EMBODIMENTS

First Embodiment

Figure 1:
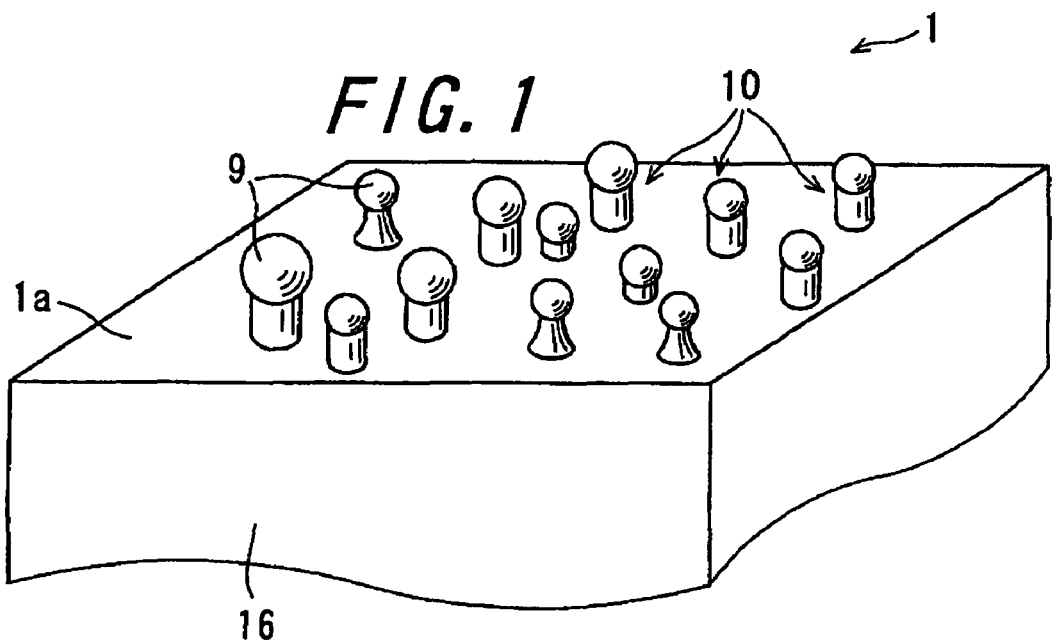
FIG. 1 is an enlarged perspective view showing a resin film 1 according to a first embodiment of the invention.
Figure 2:
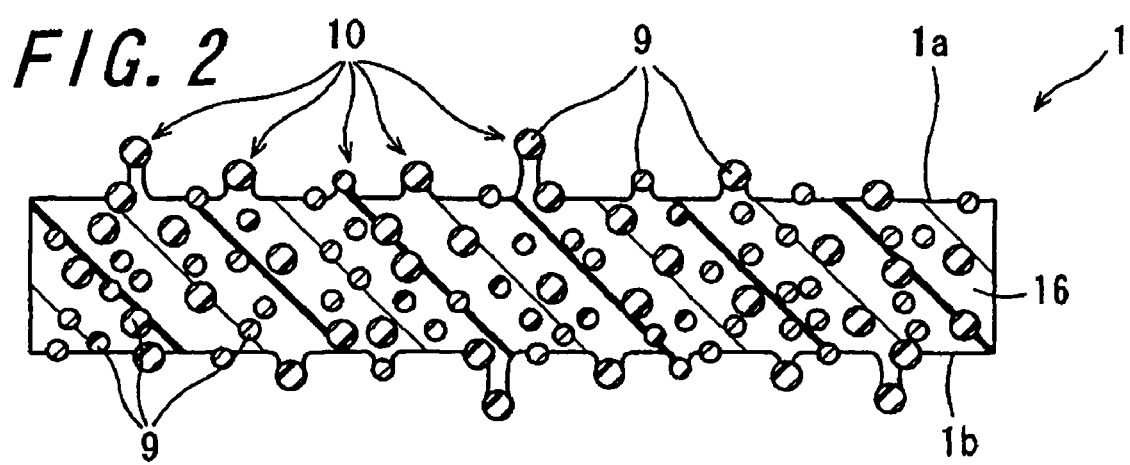
FIG. 2 is an enlarged sectional view showing the resin film 1.
Figure 3:
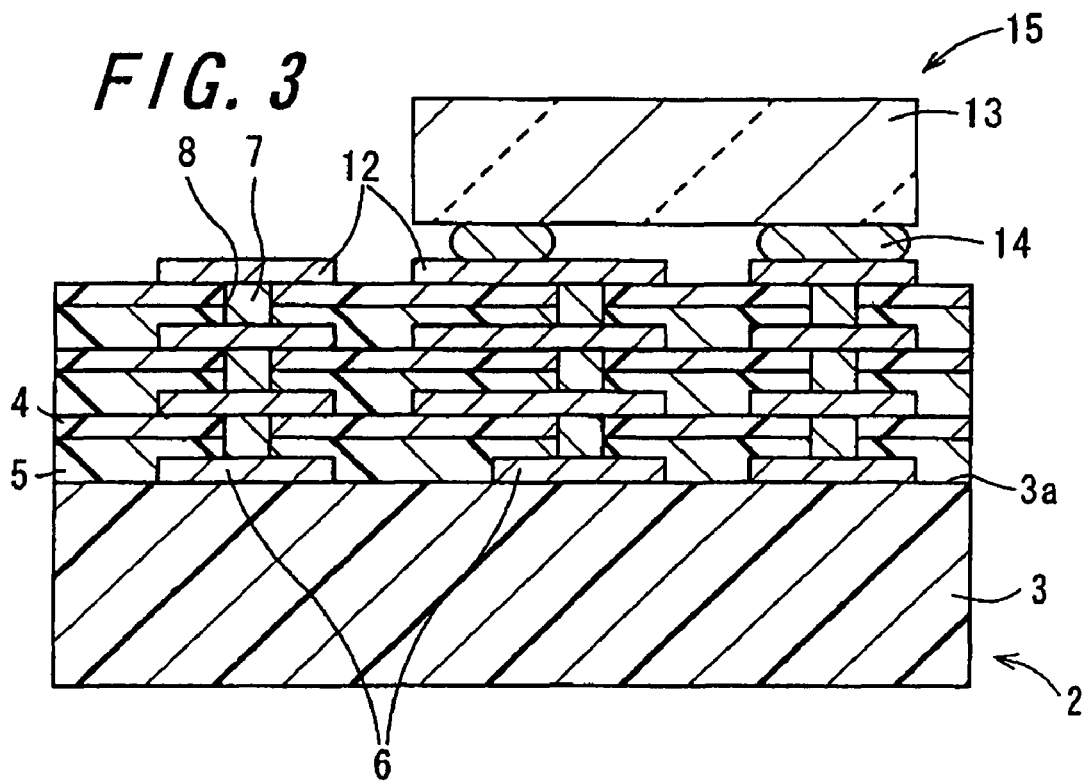
FIG. 3 is a sectional view showing a multilayer circuit board 2 in which the resin film 1 is used.
Figure 4:
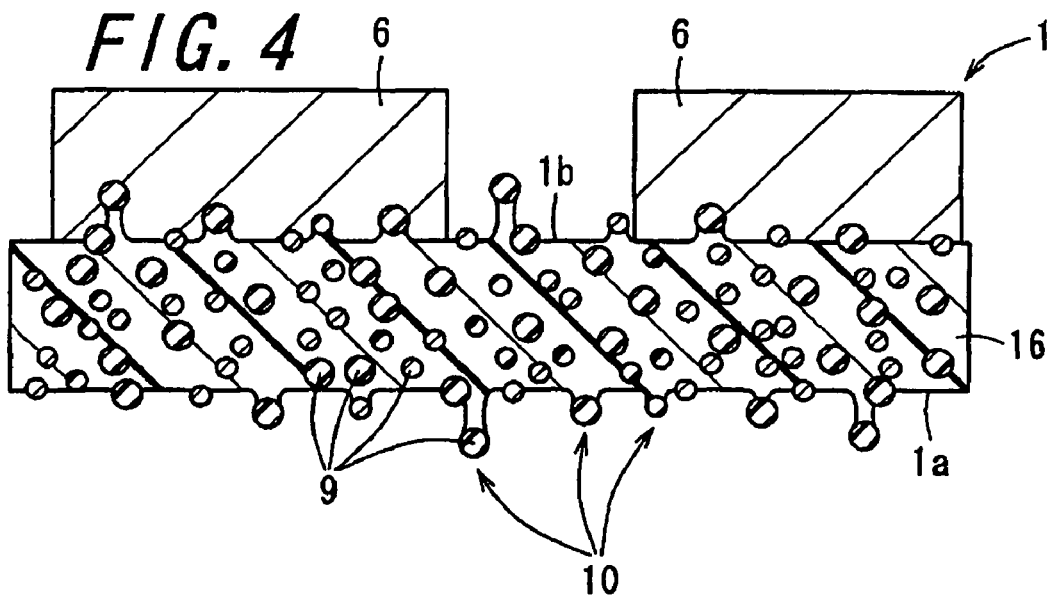
FIG. 4 is an enlarged sectional view showing the resin film 1 provided with a conductive layer 6.
Figure 5:
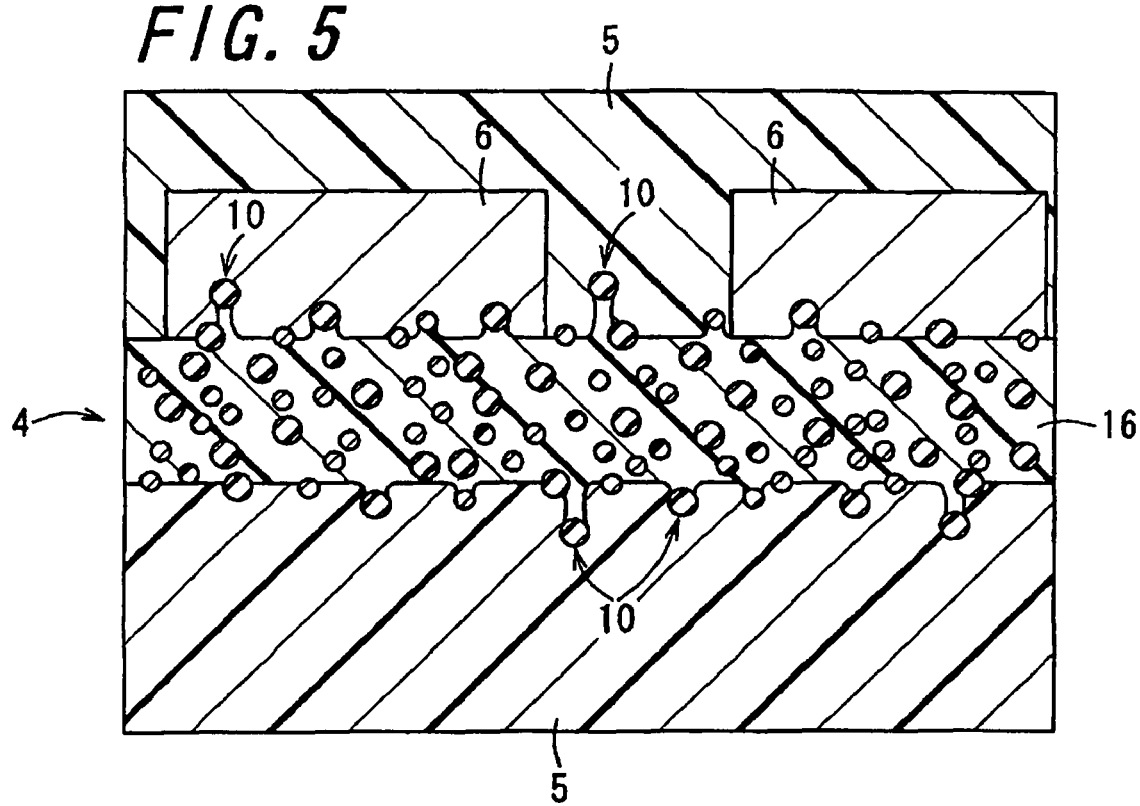
FIG. 5 is a sectional view showing an enlarged partial configuration of the multilayer circuit board 2.

Now referring to the drawings, preferred embodiments of the invention are described below. FIG. 1 is an enlarged perspective view showing a resin film 1 according to a first embodiment of the invention. FIG. 2 is an enlarged sectional view showing the resin film 1. FIG. 3 is a sectional view showing an electronic apparatus 15 in which the resin film 1 is used. FIG. 4 is an enlarged sectional view showing the resin film 1 provided with a conductive layer 6. FIG. 5 is a sectional view showing an enlarged configuration of a multilayer circuit board 2 associated with the resin film 1. FIG. 6 is an enlarged sectional view showing a projected portion 10 of the resin film 1.

As shown in FIG. 3, the electronic apparatus 15 includes a semiconductor element 13 as an electronic element, the multilayer circuit board 2, and a conductive bonding material 14 that electrically connects the semiconductor element and the multilayer circuit board 2. The multilayer circuit board 2 includes a core board 3, an insulating layer 4, an adhesive layer 5, a conductive layer 6, and an electrode pad 12. The multilayer circuit board 2 includes the conductive layer 6 and insulating layer 4 which are laminated on the core board 3 alternately one after another with the adhesive layer 5 interposed therebetween in a thickness direction.

As illustrated in FIG. 3, the core board 3 is in a substantially plate-like shape, and has one main surface 3a on which the conductive layer 6 and the insulating layer 4 are laminated alternately with the adhesive layer 5 interposed therebetween. In other words, the core board 3 functions as a supporting member that supports the conductive layer 6, the insulating layer 4 and the adhesive layer 5. The core board 3 has insulating properties. The core board 3 is made of, for example, oxide-based ceramics such as an aluminum oxide sintered compact and a mullite sintered compact, non-oxide-based ceramics such as an aluminum nitride sintered compact and a silicon carbide sintered compact, the non-oxide-based ceramics having an oxide film on the one main surface 3a, or a fiber board in which a glass fiber board is impregnated with a resin, or the like.

The conductive layer 6 functions as a transmission path to transmit electric signals. The conductive layer 6 is made of, for example, one kind or plural kinds of conductive materials such as copper and/or gold. The conductive layer 6 may include a plurality of layers. For example, when the conductive layer 6 has a structure in which a first conductive layer made of a sputtered layer or an electroless plating layer, and a second conductive layer made of an electroplating layer are laminated, the conductive layer 6 is formed by a following method. The first conductive layer is formed on the core board 3 and/or the insulating layer 4 using a sputtering method or an electroless plating method. Then, the second conductive layer is formed on the first conductive layer by an electroplating method utilizing the first conductive layer as an electrode, and thereby the conductive layer 6 is formed.

The insulating layer 4 has a function to prevent the conductive layers 6 lying near to each other in the thickness direction from being in contact with each other. The conductive layer 6 is laminated on the core board 3 and the insulating layer 4. In addition, the insulating layer 4 is laminated on the conductive layer 6 through the adhesive layer 5. The conductive layer 6 forms a conductive pattern so that the conductive layer 6 is not laminated over the whole region of the one main surface 3a of the core board 3 or the insulating layer 4 but provided in part. In this way, according to the desired number of the conductive layer 6, the insulating layer 4 and the conductive layer 6 are laminated alternately. The insulating layer 4 and the adhesive layer 5 are formed with a through-hole 8 that penetrates through these layers 4 and 5 in the thickness direction. A through-conductor 7 is embedded in the through-hole 8. Some of the conductive layers 6 that are arranged on different planes are electrically connected by the through conductor 7.

An electrode pad 12 has a function as a transmission path to transmit electric signals between the multilayer circuit board 2 and the semiconductor element 13 as an exemplary electronic element mounted on the multilayer circuit board 2. The electrode pad 12 is provided on the outer most insulating layer 4 among the plurality of insulating layers 4, and is electrically connected to the through-conductor 7. Thereby, the electrode pad 12 is electrically connected to the conductive layer 6. The electrode pad 12 is made of conductive materials such as copper and/or gold. The electrode pad 12 is configured to have, for example, the same structure as the conductive layer 6.

The insulating layer 4 includes a filler 9, and is made of the resin film 1 formed in a sheet-like shape. The resin film 1 is configured to have a thickness of around not less than 3 μm and not more than 50 μm. The adhesive layer 5 is interposed between the core board 3 and the insulating layer 4, or between the insulating layers 4 lying near to each other in the thickness direction. The adhesive layer 5 is made of, for example, an epoxy resin. The adhesive layer 5 is formed, for example, by applying an adhesive on the insulating layer 4 by a doctor blade method, and then drying the adhesive. The adhesive layer 5 is configured to have a thickness of around not less than 3 μm and not more than 20 μm. The adhesive layer 5 is heated and pressurized, by using a heating/pressurizing device, in a state of being laminated on the core board 3 and the conductive layer 6 to be bonded to the core board 3 and the conductive layer 6.

A combination of materials of the insulating layer 4 and the adhesive layer 5 is selected so as to have an excellent adhesiveness of the insulating layer 4 and the adhesive layer 5, and to have high heat resistance. Thereby, when the multilayer circuit board 2 is mounted on a printed board etc., the resistance to a heat applied in a solder bonding step becomes excellent. In addition, the combination of materials of the insulating layer 4 and the adhesive layer 5 is selected so that a difference between coefficients of thermal expansion of the insulating layer 4 and the adhesive layer 5 is smaller. Thereby, it is possible to reduce a thermal stress caused by the difference between coefficients of thermal expansion, and to reduce a stress causing a separation in an interface of the conductive layer 6 and the through conductor 7. In addition, it is possible to realize the multilayer circuit board 2 which can reduce a warpage of the entire multilayer circuit board 2 and properly correspond to a narrower pitch of terminals in an electronic element such as the semiconductor element 13, mounted on the surface of the multilayer circuit board 2.

The filler 9 is contained in the resin film 1 constituting the insulating layer 4 in order to adjust coefficients of thermal expansion and to improve mechanical strength. The filler 9 is, for example, an inorganic filler, and made of ceramics. The ceramics used for the inorganic filler is made of, for example, silica (silicon dioxide), aluminum oxide, titanium oxide, barium titanate, strontium titanate, and/or calcium titanate. In the embodiment, silica is used as the filler 9.

A particle shape of the filler 9 may include a variety of shapes such as a substantially spherical shape, acicular shape, and/or flake shape, and the substantially spherical shape is preferable in a viewpoint from a filling property. A silica particle has a diameter of around not less than 20 nm and not more than 500 nm. The filler 9 preferably has a diameter smaller than one-tenth of the thickness of the resin film 1.

As shown in FIGS. 1 and 2, the resin film 1 in the embodiment has a sheet portion 16 that has substantially flat one main surface 1a and the other main surface 1b, and a plurality of projected portions 10 that protrude from the one main surface 1a and the other main surface 1b of the sheet portion 16. The sheet portion 16 includes a resin material and a filler contained in the resin material. As shown in FIG. 6, the projected portion 10 has a columnar portion 10b that is made of the same resin material as the resin material constituting the sheet portion 16, and that is connected to the sheet portion 16; and an apex portion 10a that is connected to the columnar portion 10b, and that includes the substantially spherical filler particle 9. In other words, at least one projected portion 10 has the substantially spherical filler particle 9 in the apex portion 10a in its projecting direction, and a surface 9a of the filler particle 9 is exposed. In addition, as shown in FIG. 6, a height h1 of at least one projected portion 10 is larger than a diameter D1 of the filler particle 9 in the apex portion 10a.

Further, the heights h1 in the projecting direction of each of the projected portions 10 are not even and show the variation. The heights h1 of each of the projected portions 10 are preferably set to be not less than one time and not more than three times the diameter D1 of the filler particle 9 of the projected portion 10. In this case, it is possible to enhance adhesion strength, while effectively preventing a breakage of the projected portions 10.

When the resin film 1 is used for the multilayer circuit board 2, the projected portions 10 of the resin film 1 may be closely brought into contact with the adhesive layer 5, or may be closely brought into contact with the conductive layer 6. In the latter case, as shown in FIG. 4, the respective projected portions 10 are preferably embedded in the conductive layer 6. In addition, the conductive layers 6 may be closely brought into contact with one of the one main surface 1a and the other main surface 1b of the sheet portion 16, and the adhesive layers 5 may be closely brought into contact with the other of them respectively. In this case, the projected portions 10 of the resin film 1 are embedded in both of the conductive layer 6 and the adhesive layer 5 to form a laminate, and then adhere the laminate to the core board 3, and thereby the multilayer circuit board is produced. As described above, the resin film 1 functions as the insulating layer 4 in the multilayer circuit board.

In the multilayer circuit board that is constituted such that the conductive layer 6 and the adhesive layer 5 are closely brought into contact with the one main surface 1a and the other main surface 1b of the sheet portion 16, respectively, as shown in FIG. 5, each of the projected portions 10 of the insulating layer 4 are embedded in the adhesive layer 5 and the conductive layer 6. In other words, the adhesive layer 5 and the conductive layer 6 cover the columnar portions 10b and the apex portions 10a of the projected portions 10.

As described above, each of the projected portions 10 has the columnar portion 10b made of a resin, and the apex portion 10a that is connected to the columnar portion 10b and that includes the filler particle 9. In the filler particle 9, the remained surface 9a except for a portion 9b that is connected to the columnar portion 10b is substantially exposed. In at least one projected portion 10, a minimum width D2 of the columnar portion 10b (a width in a direction perpendicular to the thickness direction of the resin film 1) is smaller than the diameter D1 of the filler particle 9 of the projected portion 10. The minimum width D2 of the columnar portion 10b is, for example, set so as to be not less than 0.5 time and not more than 0.95 time the diameter D1 of the filler particle 9. The diameter D1 of the particle 9 and the minimum width D2 of the columnar portion 10b are set in this way, and therefore there may be no separation of the filler particle 9 from the columnar portion 10b caused by the too-large-size filler particle 9 with respect to the columnar portion 10b, and it is possible to firmly adhere the insulating layer 4 onto the conductive layer 6 and/or the adhesive layer 5. In addition, the height h1 of the projected portion 10 is preferably set so as to be around 2 to 20 times the height h of the columnar portion 10b. The projected dimension h1 set in this way make it possible to prevent the adhesion strength between the insulating layer 4 and the conductive layer 6 and/or the adhesive layer 5 from being lowered, while properly preventing the breakage of the projected portions 10. In addition, an area where the width of the projected portion 10 (a width in a direction perpendicular to the thickness direction of the insulating layer 4) is the largest, is preferably located at the apex portion 10a. In this case, it is possible to further enhance an anchor effect by the projected portion 10.

A method for forming each of such projected portions 10 is described. For example, a resin sheet that has a plate-shaped surface and includes the filler particle 9 is etched using a dry etching or a plasma etching capable of controlling an etching direction. Specifically, the surface of the resin sheet is subject to the dry etching. Since the filler particle 9 included in the resin sheet is formed by a harder material than a resin of silica or the like, the filler particle 9 is hardly dissolved by the dry etching. Thereby, an area right under the filler particle 9 is hardly etched and the projected portion 10 that has the filler particle 9 in the apex portion 10a is formed. Accordingly, it is possible to adjust the shape, number, and/or density of the projected portion 10 by an etching amount in the dry etching, and an amount and density of the silica 9. Generally, the larger the etching amount is, the higher the height h1 of the projected portion 10 is. Further, the larger the density of the filler particle 9 is, the larger the density of the projected portion 10 is. Furthermore, the larger the diameter D1 of the particle 9 is, the larger the minimum width D2 of the columnar portion 10a is. Such an etching amount in the dry etching is determined by the etching time and the etching rate. In addition, the number of the projected portions 10 per unit area (per square millimeter) is set as, for example, not less than 100,000 and not more than 100,000,000. Adjusting the content of the filler 9 makes it possible to adjust the adhesion strength of the adhesive layer 5 and the conductive layer 6, and the insulating layer 4.

As described above, the resin film 1 that is used for the multilayer circuit board 2 of the embodiment is made of a resin including the filler 9, and has the plurality of projected portions 10 that protrude from the one main surface 1a of the sheet portion 16. Each of the projected portions 10 includes the filler particle 9 that has harder hardness than the resin in the apex portions 10a. As a result, the apex portions 10a of each of the projected portions 10 become hard, and it is possible to embed each of the projected portions 10 in the adhesive layer 5 without largely damaging each of the projected portions 10 when the resin film 1 is laminated on the adhesive layer 5. Accordingly, it is possible to enhance the adhesive strength between the resin film 1 and the adhesive layer 5. A hardness measurement is performed by a micro-Vickers hardness tester. The hardness measurement is a method in which a leading edge of a diamond indenter that is processed into a quadrangular pyramid shape is pressed onto a surface of a material to be measured under a predetermined pressure, and then the hardness is calculated by dividing the used pressure by an area of the generated indentation. When the resin is thin, or when the filler is minute, a micro-indentation method may be used instead of the micro-Vickers hardness tester. The micro-indentation method is a method in which, similar to the micro-Vickers method, a diamond indenter that is processed into a predetermined shape is pressed onto a material to be measured under a minute pressure so as to generate an indentation. The indentation is generated under a constant pressure, and it is determined that the material whose area of the generated indentation is smaller is a harder material.

In the embodiment, since the filler particle 9 included in each of the projected portions 10 is disposed to protrude from the one main surface 1a of the sheet portion 16, the filler 9 included in each of the projected portions 10 are spaced from the one main surface 1a of the sheet portion 16. Accordingly, the heights h1 of the projected portions 10 can be increased, with the result that each of the projected portions 10 can be embedded more deeply into the adhesive layer 5 when the resin film 1 is laminated on the adhesive layer 5. Accordingly, it is possible to further increase the adhesion strength between the resin film 1 and the adhesive layer 5.

In the embodiment, as shown in FIG. 5, since the projected portions 10 are set so that the largest widths in the apex portions 10a are larger than the minimum widths in the columnar portions 10b, the apex portions 10a of the projected portions 10 exhibit a high anchor effect when the resin film 1 is laminated on the adhesive layer 5. Accordingly, it is possible to further increase the adhesion strength between the resin film 1 and the adhesive layer 5.

In the embodiment, as shown in FIG. 2, each of the projected portions 10 has different heights h1 each other. In a case where the adhesive layers is formed on a surface of the resin film where the projected portions 10 are formed, when the projected portions 10 have the uniform height, then a phenomenon that the neighboring projected portions 10 contact with, or interfere with each other and air bubbles or the like remain near the columnar portions 10b can occur. However, mutually making the heights h1 of the projected portions 10 different can prevent each of the projected portions 10 from interfering each other to enhance wettability of a precursor of the adhesive layer 5 with respect to the resin film 1. Accordingly, it is possible to prevent the air bubbles from remaining in the precursor after the precursor of the adhesive layer 5 is applied. Thereby, the adhesive layer 5 is capable of being applied to be laminated adequately on the resin film 1.

In the embodiment, the filler 9 includes a particle made of silica. The silica has a relatively low coefficient of thermal expansion so that the coefficient of thermal expansion of the resin film 1 can be lowered. Accordingly, when the adhesive layer 5 is laminated on the resin film 1, it is possible to prevent the resin film 1 and the adhesive layer 5 from being damaged because of a thermal expansion.

In the embodiment, the multilayer circuit board 2 has a structure in which the conductive layer 6 and the insulating layer 4 are laminated one after another on the one main surface 3a of the core board 3. Since the insulating layer 4 is made of the resin film 1, the insulating layer 4 and the adhesive layer 5 can be easily brought into close contact with each other by the projected portions 10. Accordingly, it is possible to properly prevent the insulating layer 4 from being separated from the adhesive layer 5.

In the embodiment, as shown in FIG. 5, since the projected portions 10 are embedded and laminated in and on the adhesive layer 5, the adhesion strength between the insulating layer 4 and the adhesive layer 5 can be increased. In a case where the projected portions 10 are not in the resin film 1, the adhesion strength between the insulating layer 4 and the adhesive layer 5 can not be increased significantly. On the other hand, in the embodiment, since the projected portions 10 are present in the resin film 1, the embedded projected portions 10 in the adhesive layer 5 enable the insulating layer 4 and the adhesive layer 5 to be firmly brought into close contact with each other.

In the embodiment, the projected portions 10 are provided on the both main surfaces 1a and 1b of the sheet portion 16, and therefore, when other members (in the embodiment, other members represents the conductive layer 6 arranged on the one main surface 1a of the sheet portion 16, and the adhesive layer 5 arranged on the other main surface 1b of the sheet portion 16) are laminated on the both main surfaces 1a and 1b of the sheet portion 16, the adhesion strength between other laminated members is increased. Consequently, not only the one main surface 1a of the sheet portion 16, but also the other main surface 1b can be used effectively.

In the embodiment, the conductive layer 6 may have plural layers. When the conductive layer 6 has plural layers, the conductive layer 6 includes a sputtered layer or an electroless plating layer, and an electroplating layer. The sputtered layer or the electroless plating layer is formed on the surface of the resin film 1, and the electroplating layer is formed based on the sputtered layer or the electroless plating layer, thereby the conductive layer 6 can be realized. As a result, the conductive layer 6 can be formed on the surface of the resin film 1 made of a resin.

In the embodiment, the conductive layer 6 is provided so as to cover the apex portions 10a and the columnar portions 10b of the projected portions 10. Thereby, the whole projected portions 10 are properly covered with the conductive layer 6. Accordingly, the anchor effect by the projected portions 10 makes it possible to firmly bring the conductive layer 6 and the resin film 1 into close contact with each other.

In the embodiment, the projected portions 10 are embedded in the conductive layer 6 in a region right under the electrode pad 12. On the other hand, the electrode pad 12 is connected to a terminal of the semiconductor element 13 through the conductive bonding material 14. A stress is applied to the electrode pad 12 when the semiconductor element 13 is connected to the electrode pad 12, or while the semiconductor element 13 is being connected to the electrode pad 12. As a result, conventionally, the insulating layer 4 located right under the electrode pad 12 is easily separated by the stress. However, in the embodiment, the projected portions 10 are embedded in the conductive layer 6 right under the electrode pad 12 so that the insulating layer 4 and the conductive layer, and the insulating layer 4 and the adhesive layer 5 are firmly brought into close contact with each other, respectively. Accordingly, it is possible to prevent the insulating layer 4 and the conductive layer 6, and the insulating layer 4 and the adhesive layer 5 from being separated as much as possible, even if a large stress is applied to the electrode pad 12. The cause of the occurrence of the stress applied to the electrode pad 12 varies depending on a method of connecting the semiconductor element 13. For example, when the semiconductor element 13 is connected to the electrode pad 12 by a flip-chip connection, a thermal stress that occurs by a difference between coefficients of thermal expansion of the circuit board and the semiconductor element 13 is applied to the electrode pad 12. In addition, when the semiconductor element 13 is connected to the electrode pad 12 by a wire-bonding, a larger stress compared with a case of the flip-chip connection is applied to the electrode pad 12 because of a ultrasonic vibration for bringing the wire close contact with the pad, and an applied pressure of a bonding device.

In the embodiment, when the resin film 1 is adhered to the core board, the resin film 1 is adhered to the core board 3 through the adhesive layer 5 with the projected portions 10 embedded in the adhesive layer 5. Accordingly, it is possible to firmly bring the resin film 1 and the adhesive layer 5 into close contact with each other by the anchor effect of the projected portions 10. In addition, since the resin film 1 and the core board 3 are adhered through the adhesive layer 5, it is possible to realize the multilayer circuit board 2 in which the resin film 1 is firmly brought into contact with the core board 3.

In the embodiment, the electronic apparatus 15 has the terminal of the semiconductor element 13 and the electrode pad 12 bonded with each other through the conductive bonding material 14. Consequently, it is possible to realize the electronic apparatus 15 in which the conductive layer 6 and the resin film 1 are firmly connected.

Second Embodiment

FIG. 7 is an enlarged sectional view showing a resin film 1A of a second embodiment. In the above-described embodiment, the resin film 1 has projected portions 10 on both main surfaces, but this embodiment is not limited to this. As shown in FIG. 7 for example, the resin film 1A may have the other main surface 1b in a flat-like shape. As a result, the projected portions 10 may be formed only on the one main surface 1a of the resin film 1A, making it possible to simplify the manufacturing process of the resin film A. In addition, it is also possible to enhance the adhesive strength between and the resin film 1A, and the adhesive layer 5 or conductive layer 6 that is laminated on the other main surface of the resin film 1.

Third Embodiment

FIG. 8 is a sectional view showing an enlarged partial configuration of a multilayer circuit board 2A according to a third embodiment. In the embodiment, the projected portions 10 are provided on an inner surface of the through-hole 8 that penetrates through the insulating layer 4.

A method of producing the multilayer circuit board 2A according to this embodiment is, for example, performed as follows.

(1) The conductive layer 6 is formed on one main surface 3a of the core board 3 by such as electroless plating or electroplating.

(2) The adhesive layer 5 is formed on the one main surface 3a of the core board 3 and the conductive layer 6, for example, by a doctor blade method.

Figure 9A:
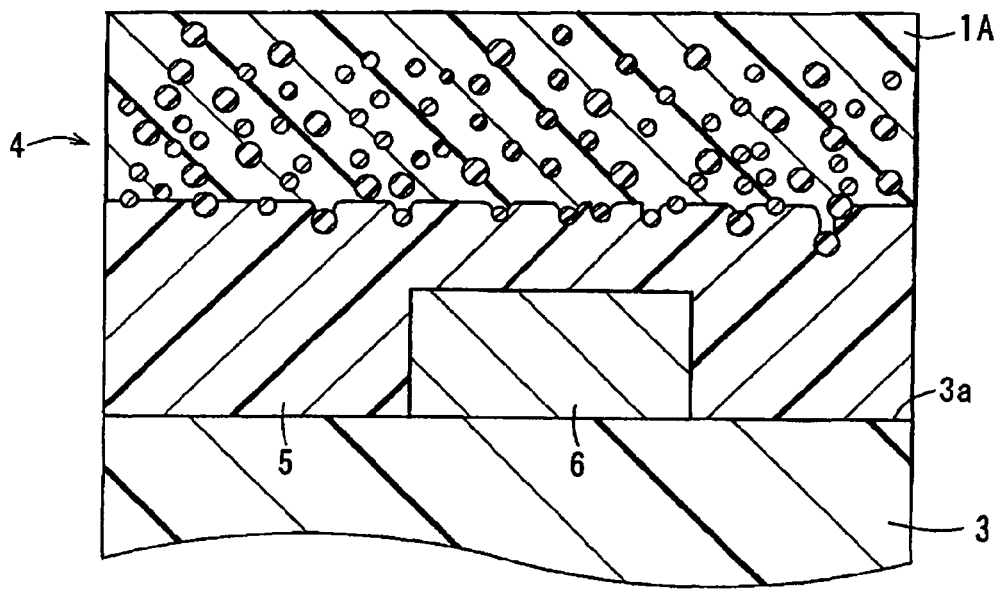
FIG. 9A is a sectional view for explaining a method of producing the multilayer circuit board 2A shown in FIG. 8.

(3) As shown in FIG. 9A, the resin film 1A according to the second embodiment, that has the projected portions 10 only on the one main surface, is adhered on the adhesive layer 5. The resin film 1A is arranged so that the projected portions 10 of the resin film are contact with the adhesive layer 5.

Figure 9B:
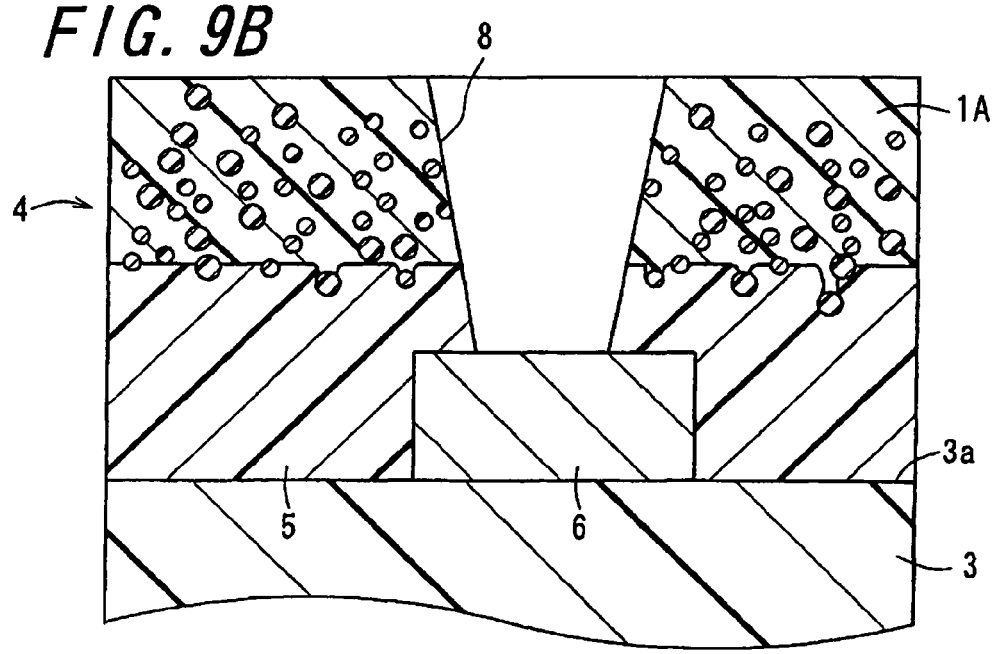
FIG. 9B is a sectional view for explaining the method of producing the multilayer circuit board 2A shown in FIG. 8.

(4) As shown in FIG. 9B, the through-hole 8 that penetrates through the resin film 1A and the adhesive layer 5 is formed to reach the conductive layer 6, for example, by laser processing. The through-hole 8 has an inner surface inclined so that diameter thereof becomes smaller toward the core board 3.

Figure 9C:
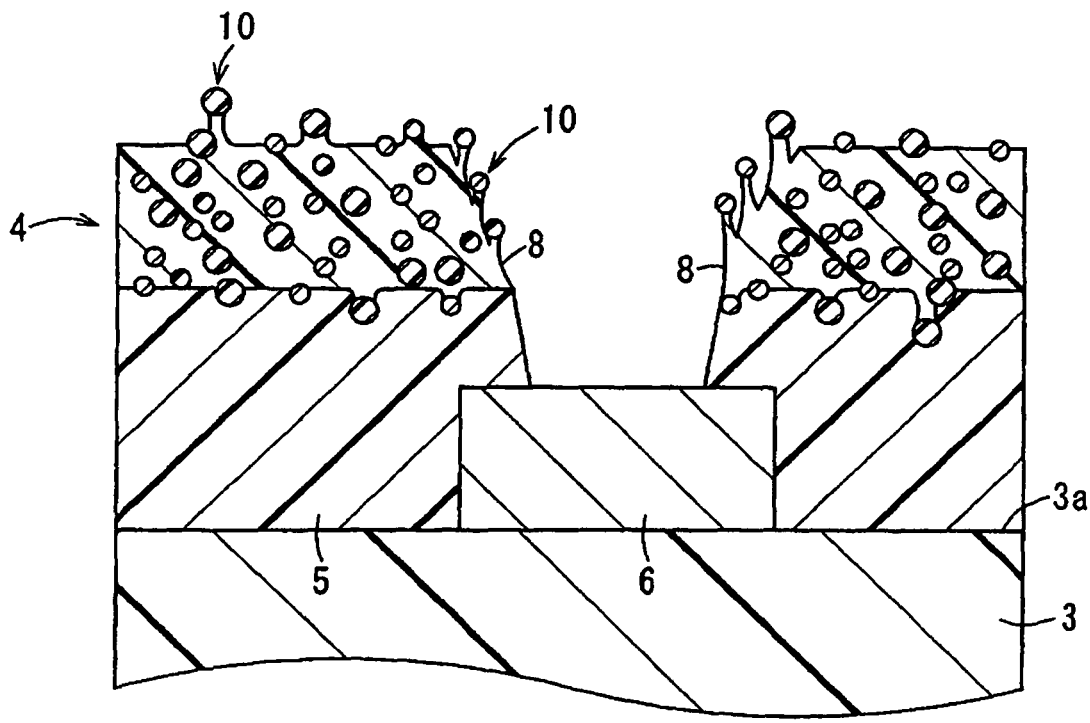
FIG. 9C is a sectional view for explaining the method of producing the multilayer circuit board 2A shown in FIG. 8.

(5) As shown in FIG. 9C, the other main surface of the resin film 1A and the inner surface of the through-hole 8 are subjected to the dry etching along the thickness direction. Thereby, the projected portions 10 are formed on both of the other main surface of the resin film 1A and the inner surface of the through-hole 8, and the resin film 1A becomes the insulating layer 4. Since the inner surface of the through-hole 8 is inclined so that the diameter of the through-hole 8 becomes smaller toward the depth direction of the through-hole 8, the inner surface is easily subjected to the dry etching and the projected portion 10 is easily formed. In addition, since the conductive layer 6 is exposed from the through-hole 8, foreign matters such as oils and residues of resin adhered to the surface of the conductive layer 6, and organic fibers adhered at the production, are properly removed by the dry etching, a connection failure of the conductive layer 6 and the through-conductor 7 to be formed later is prevented, contributing to the improvement of the yield rate.

Figure 9D:
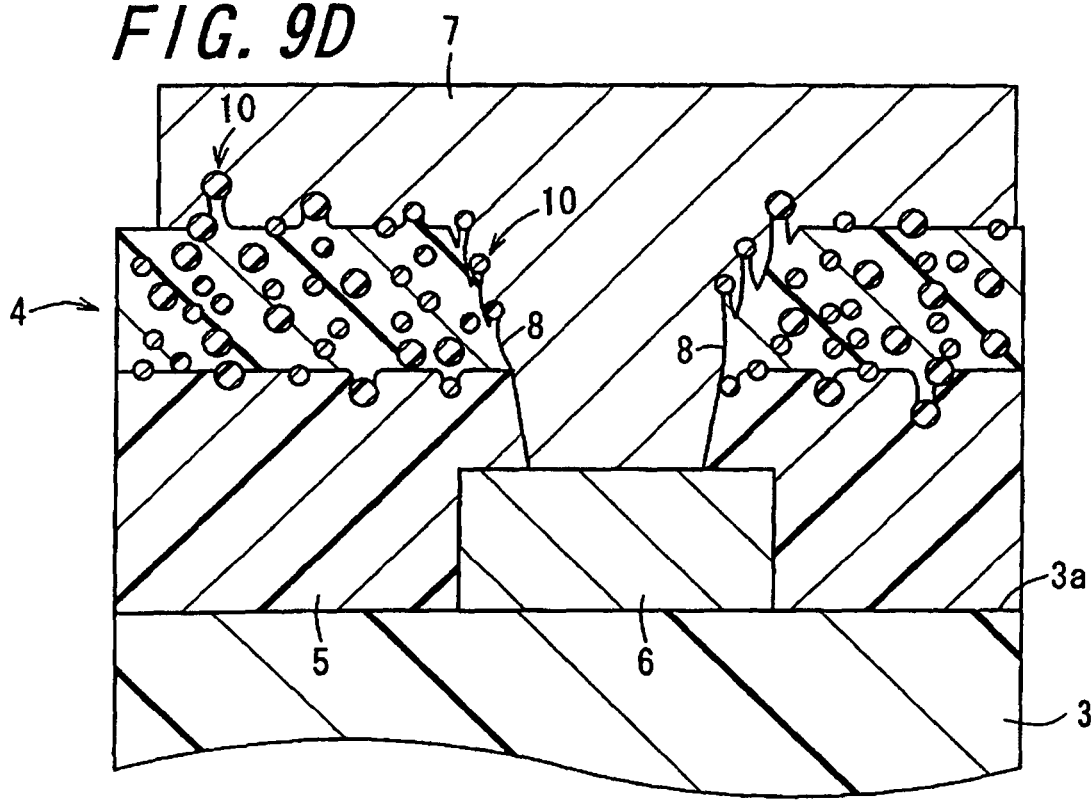
FIG. 9D is a sectional view for explaining the method of producing the multilayer circuit board 2A shown in FIG. 8.

(6) As shown in FIG. 9D, the through-conductor 7 is provided in the through-hole 8, and the conductive layer 6 is provided on the insulating layer 4, respectively, by electroplating.

(7) The adhesive layer 5 is formed on the insulating layer 4 and the conductive layer 6, for example, by a doctor blade method.

Thereafter, all or part of the steps (3) to (7) are repeated to produce the multilayer circuit board 2A.

In this way, in the embodiment, the projected portions 10 are formed not only on both main surfaces of the insulating layer 4, but also on the inner surface of the through-hole 8. As a result, it is possible to provide the projected portions 10 embedded in the through-conductor 7 formed in the through-hole 8, to enhance the adhesive strength between the insulating layer 4 and the through-conductor 7. Accordingly, it is possible to prevent the through-conductor 7 from being separated from the insulating layer 4 undesirably as much as possible, and to improve connection reliability of the through-conductor 7.

In the embodiment, the projecting direction of the projected portions 10 formed on the inner surface of the through-hole 8, is substantially the same as the thickness direction of the insulating layer 4, but it is not limited to such a direction. The projected portion 10 may be projected in a direction crossing the thickness direction (for example, a width direction or a length direction vertical to the thickness direction of the insulating layer 4), or may be projected in a direction vertical to the inner surface of the through-hole 8. In this way, the projected portions can be produced by controlling the etching direction.

Other Embodiments

In each of the above-mentioned embodiments, while the multilayer circuit board 2 is realized by laminating the resin film 1 on the one main surface 3a of the core board 3, but it is not limited to this. The multilayer circuit board 2 may be realized by laminating the plurality of resin films 1 not only on one main surface, but also on the other main surface of the core board 3. When both of the main surfaces of the core board 3 are used, a core through-conductor that penetrates in the thickness direction of the core board 3, and that electrically connects the conductive layers provided on both of the main surfaces of the core board 3, may be formed in the core board 3.

In each of the above-mentioned embodiments, while the multilayer circuit board 2 has the core board 3, a coreless multilayer circuit board 2 with no core board 3 exists, may be formed.

In each of the above-mentioned embodiments, although an example in which the resin film 1 is applied to the multilayer circuit board has been described, the resin film 1 may be applied to a circuit board of a single layer, not multilayer. In addition, the resin film 1 may be bonded so that the projected portions 10 are embedded in the sheet-shaped adhesive layer 5 to constitute an adhesive sheet by the resin film 1 and the adhesive layer 5.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A resin film comprising:
   a plurality of projected portions on a surface of the resin film, each of the projected portions including a filler and a resin material, the filler being in an apex portion of the projected portion, wherein the projected portion has at the apex portion, the largest width area in a direction perpendicular to the projecting direction.

2. The resin film of claim 1, wherein the plurality of projected portions have different dimensions in a projecting direction thereof.

3. The resin film of claim 1, wherein the filler includes particles comprising silica.

4. The resin film of claim 1, further comprising a sheet portion containing the filler and the resin material both constituting the projected portions,
   wherein the projected portions are provided on at least one main surface of the sheet portion.

5. The resin film of claim 4, wherein the projected portions are provided on both of main surfaces of the sheet portion.

6. The resin film of claim 4, wherein the projected portions each have a columnar portion that connects the apex portion and the sheet portion, and a width of the apex portion is larger than a width of the columnar portion.

7. A circuit board, comprising:
   a conductive layer; and
   an insulating layer comprising the resin film of claim 1 in which the projected portions are embedded in the conductive layer.

8. A circuit board, comprising:
   a conductive layer;
   an adhesive layer arranged on the conductive layer; and
   an insulating layer arranged on the adhesive layer; and comprising a resin film, wherein the resin film comprises a plurality of projected portions on a surface of the resin film, each of the projected portions including a filler and a resin material, the filler being in an apex portion of the projected portion.

9. The circuit board of claim 8, wherein the projected portions of the insulating layer are embedded in the adhesive layer.

10. The circuit board of claim 7, further comprising:
    an electrode pad electrically connected to the conductive layer,
    wherein the projected portion is positioned right under the electrode pad.

11. A circuit board, comprising:
    an insulating layer comprising a resin film;
    a pair of conductive layers arranged on both of main surfaces of the insulating layer; and
    a through-conductor electrically connecting the conductive layers, arranged in a through-hole provided in the insulating layer,
    wherein the resin film comprises a plurality of projected portions on a surface of the resin film, each of the projected portions including a filler and a resin material, the filler being in an apex portion of the projected portion,
    wherein the projected portions of the insulating layer being further provided on an inner surface of the through-hole, and the projected portions in the through-hole being embedded in the through-conductor.

12. The circuit board of claim 8, further comprising:
    a substrate supporting the insulating layer, the conductive layer and the adhesive layer,
    wherein the insulating layers is adhered to the substrate through the adhesive layer in a state where the projected portions are embedded in the adhesive layer.

13. An electronic apparatus, comprising:
    the circuit board of claim 10; and
    an electronic element electrically connected to the electrode pad of the circuit board, mounted on the circuit board.

14. The electronic apparatus of claim 13, wherein a terminal of the electronic element and the electrode pad are bonded through a conductive bonding material.

15. An adhesive sheet, comprising:
    the resin film of claim 1; and
    an adhesive layer on the surface where the projected portions of the resin film are formed, the projected portions being embedded in the adhesive layer.

* * * * *